(12) United States Patent
Fukasawa et al.

(10) Patent No.: US 9,799,596 B2
(45) Date of Patent: Oct. 24, 2017

(54) WIRING SUBSTRATE AND SEMICONDUCTOR DEVICE

(71) Applicant: SHINKO ELECTRIC INDUSTRIES CO., LTD., Nagano-shi, Nagano-ken (JP)

(72) Inventors: Ryo Fukasawa, Nagano (JP); Takehito Terasawa, Nagano (JP)

(73) Assignee: Shinko Electric Industries Co., Ltd. (JP)

( * ) Notice: Subject to any disclaimer, the term of this patent is extended or adjusted under 35 U.S.C. 154(b) by 0 days.

(21) Appl. No.: 15/425,390

(22) Filed: Feb. 6, 2017

(65) Prior Publication Data

US 2017/0229388 A1    Aug. 10, 2017

(30) Foreign Application Priority Data

Feb. 8, 2016    (JP) ................................ 2016-021698

(51) Int. Cl.
    *H01L 23/498*    (2006.01)
    *H01L 23/00*     (2006.01)
    *H01L 23/31*     (2006.01)
    *H01L 25/11*     (2006.01)

(52) U.S. Cl.
    CPC .... *H01L 23/49838* (2013.01); *H01L 23/3128* (2013.01); *H01L 23/49816* (2013.01); *H01L 23/49827* (2013.01); *H01L 24/09* (2013.01); *H01L 24/17* (2013.01); *H01L 25/117* (2013.01); *H01L 2224/0401* (2013.01); *H01L 2225/1035* (2013.01)

(58) Field of Classification Search
    None
    See application file for complete search history.

(56) References Cited

U.S. PATENT DOCUMENTS

| 2013/0319740 A1* | 12/2013 | Sato ........................ | H05K 1/185 |
| | | | 174/258 |
| 2014/0104797 A1* | 4/2014 | Machida ................ | H05K 1/181 |
| | | | 361/760 |
| 2015/0257275 A1* | 9/2015 | Kusama ................. | H05K 1/185 |
| | | | 174/260 |

FOREIGN PATENT DOCUMENTS

JP    2014-049558 A    3/2014

* cited by examiner

*Primary Examiner* — Bilkis Jahan
(74) *Attorney, Agent, or Firm* — Tarolli, Sundheim, Covell & Tummino LLP

(57) ABSTRACT

A wiring substrate includes a core substrate and a cavity extending through the core substrate. The cavity has a planar shape that is rectangular, and includes corners and sides connecting the corners in a plan view. The wiring substrate also includes first through holes that extend through the core substrate and are spaced apart from the cavity. An electronic component is arranged in the cavity. The wiring substrate also includes a first insulating material with which the first through holes are filled and a second insulating material with which a gap between the electronic component and walls of the cavity is filled. The first through holes are arranged around the corners of the cavity in a plan view. Each of the first through holes is L-shaped in a plan view and formed continuously along two of the sides of the cavity that define the corresponding corner.

12 Claims, 11 Drawing Sheets

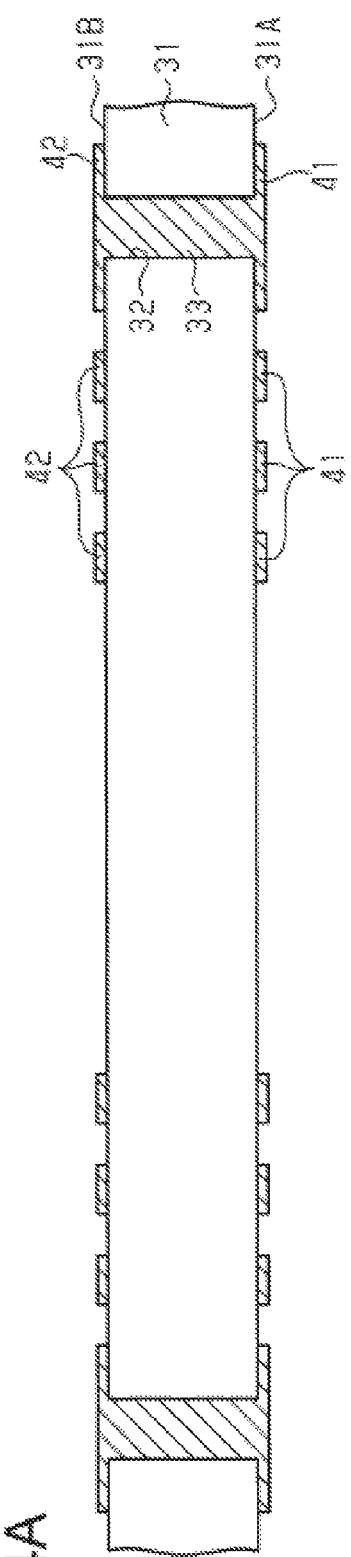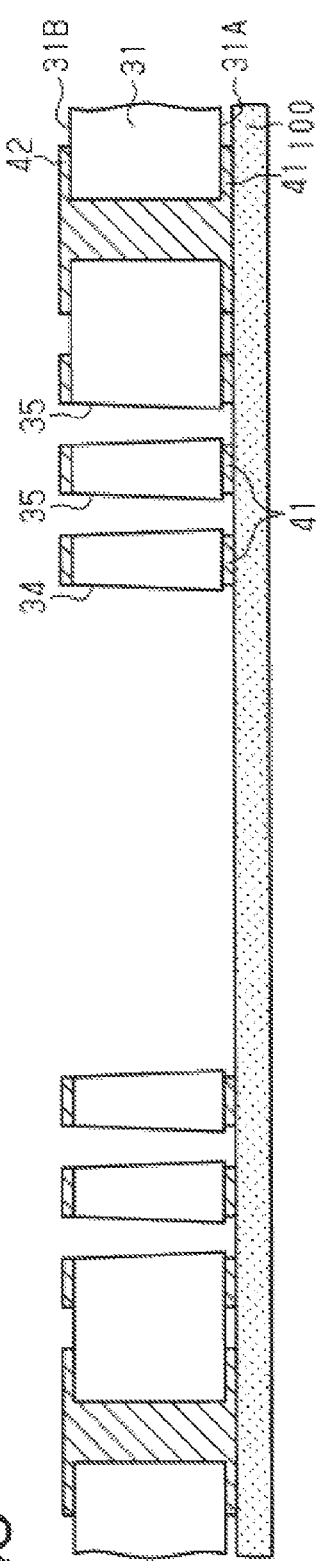

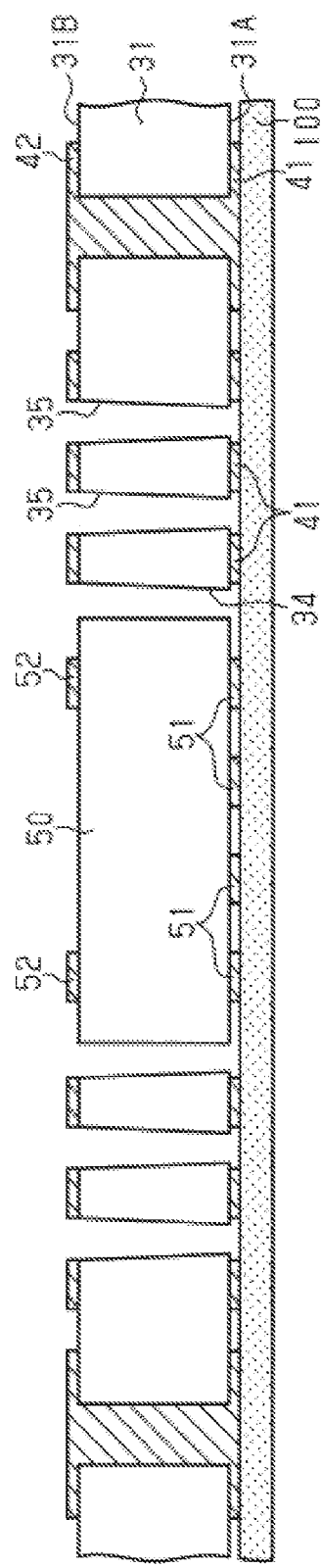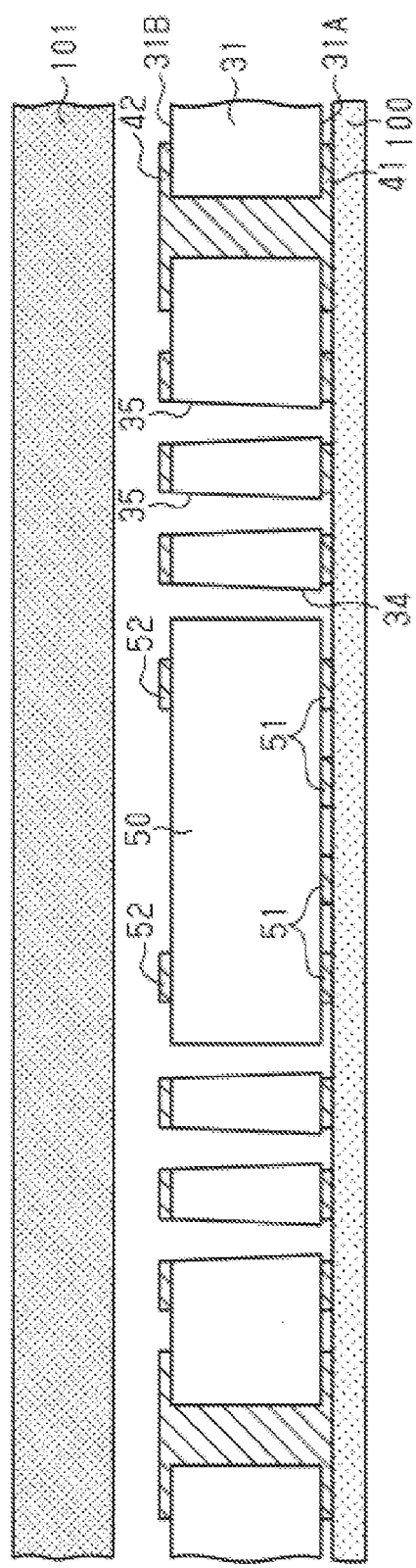

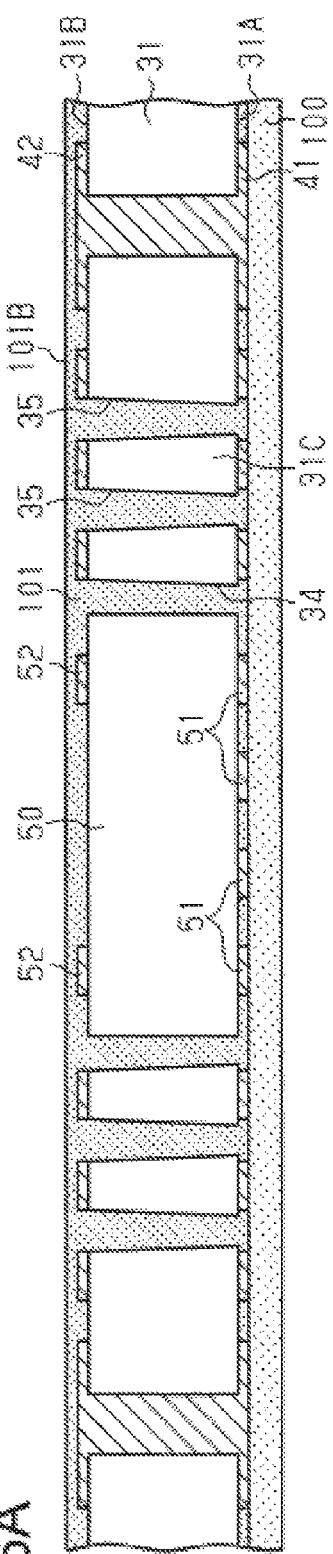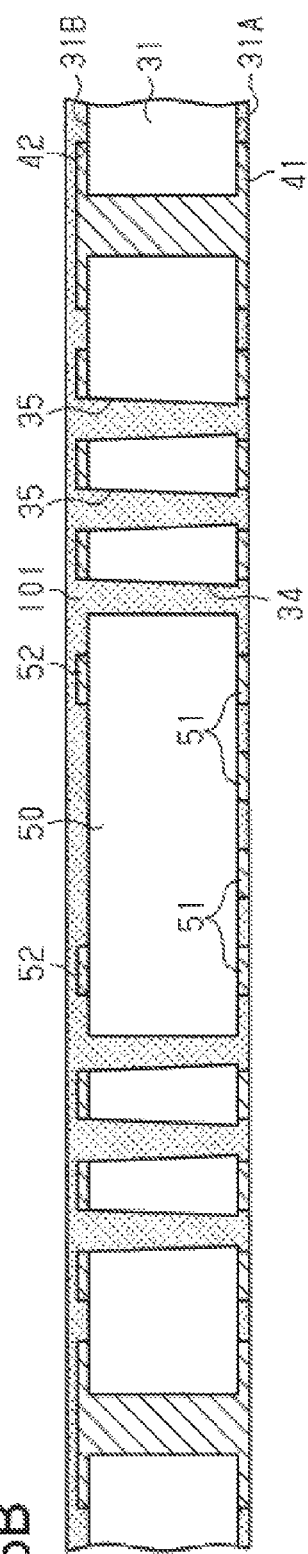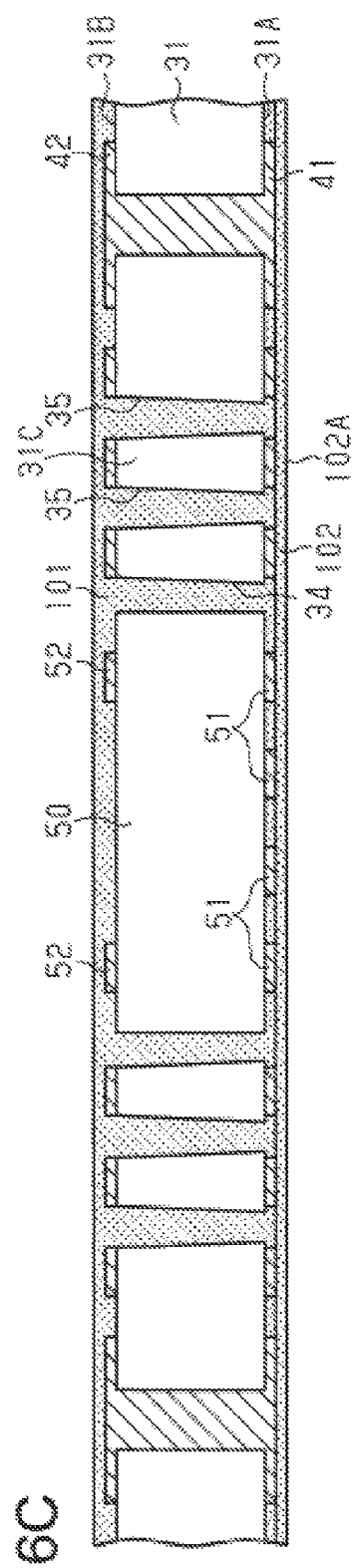

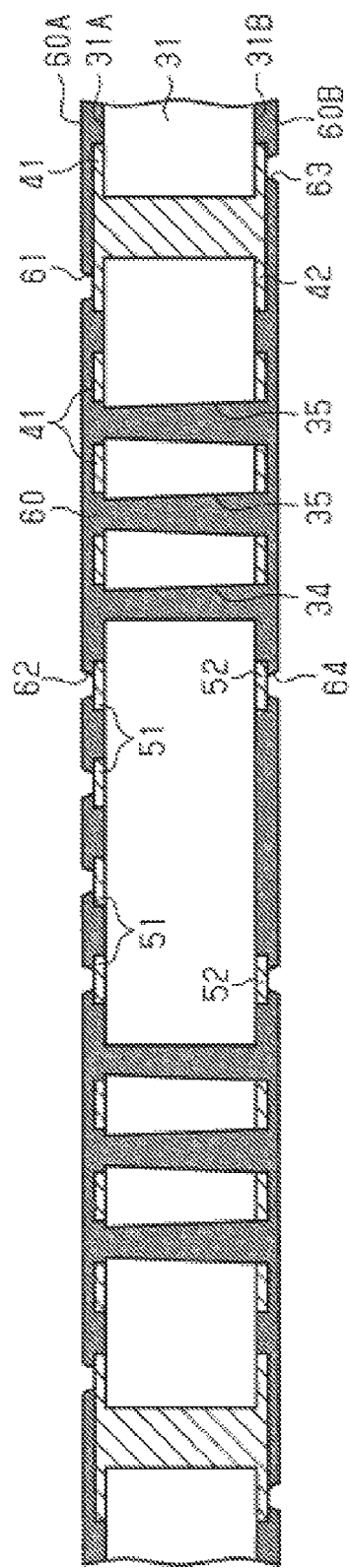
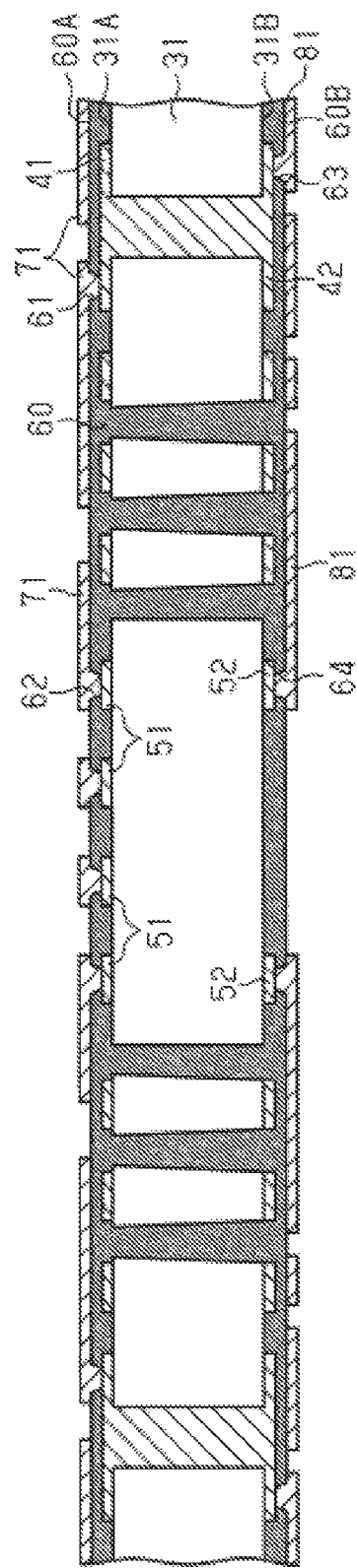
Fig.8A
Fig.8B

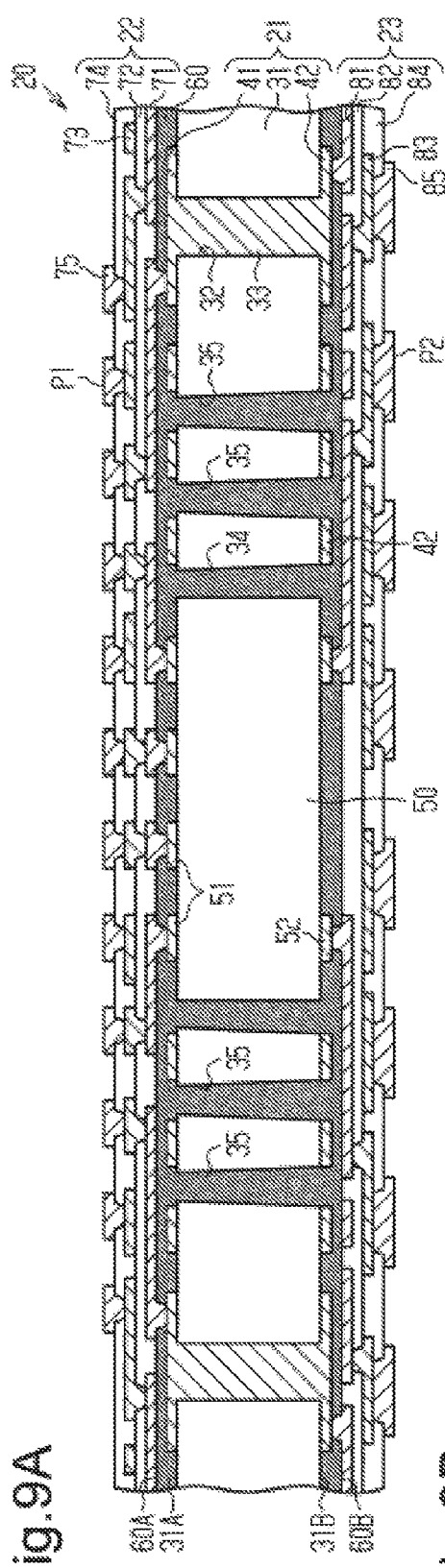
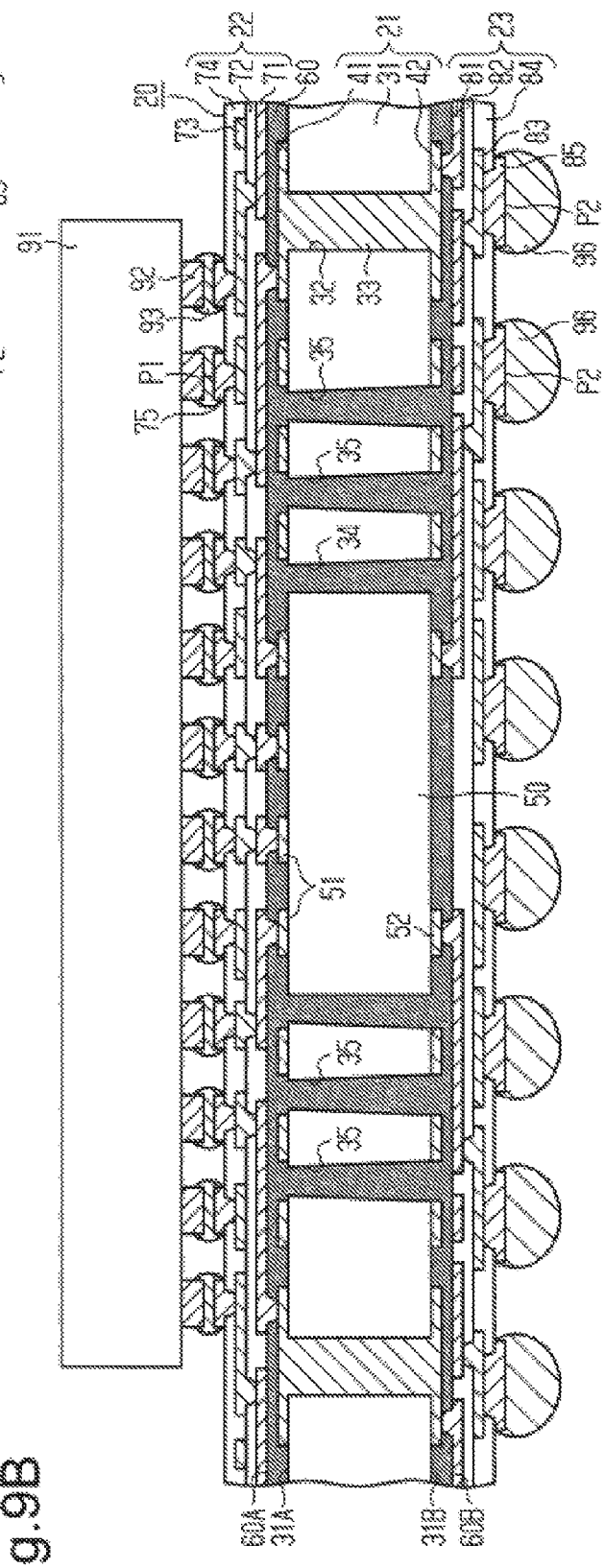
Fig. 9A
Fig. 9B

US 9,799,596 B2

WIRING SUBSTRATE AND SEMICONDUCTOR DEVICE

CROSS-REFERENCE TO RELATED APPLICATIONS

This application is based upon and claims the benefit of priority from prior Japanese Patent Application No. 2016-021698, filed on Feb. 8, 2016, the entire contents of which are incorporated herein by reference.

FIELD

This disclosure relates to a wiring substrate, a semiconductor device, and a method for manufacturing a wiring substrate.

BACKGROUND

Conventionally, a wiring substrate in which electronic components are incorporated is known. Japanese Laid-Open Patent Publication No. 2014-49558 describes an example of such wiring substrates. The electronic component is arranged in a cavity that is formed in a core substrate of the wiring substrate. The wiring substrate is manufactured by the following process. Firstly, a temporary tape is applied to one surface side of the core substrate to cover a cavity formed in the core substrate and having a larger size than the electronic component. After the electronic component is arranged in the cavity, the cavity is filled with an insulating resin. Then, the temporary tape is removed and an insulating resin is laminated on the surface of the core substrate from which the temporary tape is removed. In this manner, the structure illustrated in FIG. 11A is obtained. In this structure, the electronic component 203 is arranged in the cavity 202 of the core substrate 201. The insulating resin 204 that covers the electronic component 203 is formed on the upper and lower surfaces of the core substrate 201. The cavity 202 is filled with the insulating resin 204. At this time, the insulating resin 204 is in a semi-cured state. Then, as illustrated in FIG. 11B, the insulating resin 204 in the semi-cured state is thermally cured and hardened under a temperature atmosphere of about 150° C. to 180° C. In the thermal cure processing, the core substrate 201 and the electronic component 203 are expanded by the high temperature (refer to arrows in FIG. 11B). The position of each of the components is fixed by hardening of the insulating resin 204. Subsequently, in the step illustrated in FIG. 11C, the structure illustrated in FIG. 11B is cooled. Then, a given number of insulating layers and a given number of wiring layers are stacked on each of the upper and lower surfaces of the insulating resin 204.

The electronic component 203 has a lower coefficient of thermal expansion (CTE) than the core substrate 201. In this case, the contraction of the core substrate 201 becomes larger than that of the electronic component 203 during the cooling. This applies compressive stress to the electronic component 203 (refer to arrows in FIG. 11C). When the compressive stress applied to the electronic component 203 becomes large, the peripheral portion of the electronic component 203 is deformed by the compressive stress. Consequently, as illustrated in FIG. 11D, the electronic component 203 is protruded from one surface side. In such a case, it is difficult to form wirings on the insulating resin 204.

If a gap between the electronic component 203 and the walls of the cavity 202 is widely ensured, the insulating resin 204 filled in the gap may limit the compressive stress applied to the electronic component 203 during the cooling. However, when the volume of the cavity 202 is large, the cavity 202 may not be sufficiently filled with the insulating resin 204. This may form dips in the insulating resin 204 covering the top of the cavity 202. Such dips adversely affect the formation of the wiring layers on the insulating resin 204.

SUMMARY

One embodiment of this disclosure is a wiring substrate. The wiring substrate includes a core substrate. The core substrate includes a first surface and a second surface located opposite to the first surface. The wiring substrate also includes a cavity extending through the core substrate from the first surface to the second surface. The cavity has a planar shape that is rectangular, and includes corners and sides connecting the corners in a plan view. The wiring substrate also includes a plurality of first through holes extending through the core substrate from the first surface to the second surface. The first through holes are spaced apart from the cavity. The wiring substrate also includes an electronic component arranged in the cavity. The wiring substrate also includes a first insulating material with which the first through holes are filled and a second insulating material with which a gap between the electronic component and walls of the cavity is filled. The first through holes are arranged around the corners of the cavity in a plan view, and each of the first through holes is L-shaped in a plan view and formed continuously along two of the sides of the cavity that define a corresponding one of the corners.

Other embodiments and advantages thereof will become apparent from the following description, taken in conjunction with the accompanying drawings, illustrating by way of example the principles of this disclosure.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which:

FIGS. 4A to 4C, 5A, 5B, 6A to 6C, 7A, 8A, 8B, and 9A are schematic cross-sectional views illustrating a method for manufacturing the wiring substrate of FIG. 1;

FIG. 9B is a schematic cross-sectional view illustrating a method for manufacturing the semiconductor device of FIG. 3 subsequent to the step of FIG. 9A;

DESCRIPTION OF THE EMBODIMENTS

Figure 1:
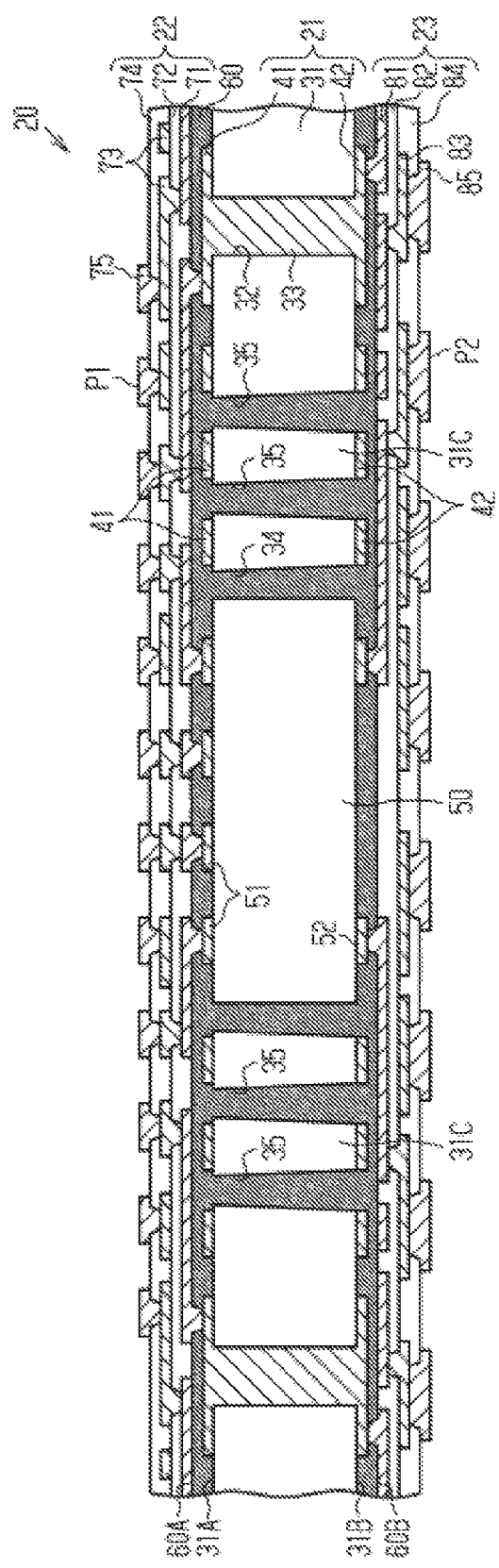
FIG. 1 is a schematic cross-sectional view illustrating a wiring substrate taken along line 1-1 in FIG. 2A.

One embodiment will now be described with reference to the accompanying drawings. In the drawings, elements are illustrated for simplicity and clarity and have not necessarily been drawn to scale. To facilitate understanding, hatching lines may not be shown or be replaced by shadings in the cross-sectional drawings.

As illustrated in FIG. 1, a wiring substrate 20 includes a core unit 21. The core unit 21 includes a core substrate 31, a wiring layer 41 formed on a first surface 31A (upper surface in FIG. 1) of the core substrate 31, and a wiring layer 42 formed on a second surface 31B (lower surface in FIG. 1) of the core substrate 31. The core substrate 31 may be, for example, a glass epoxy substrate obtained by impregnating a glass cloth (glass woven cloth), which is a reinforcement material, with a thermosetting insulative resin, the main component of which is an epoxy resin, and hardening the thermosetting insulative resin. The reinforcement material is not limited to glass cloth. Examples of reinforcement materials that may be used include glass non-woven cloth, aramid woven cloth, aramid non-woven cloth, liquid crystal polymer (LCP) woven cloth, or LCP non-woven cloth. The thermosetting insulative resin is not limited to an epoxy resin and may be, for example, a resin material such as a polyimide resin or a cyanate resin.

Through holes 32 are formed at given locations in the core substrate 31. The through holes 32 extend through the core substrates 31 from the first surface 31A to the second surface 31B in a thickness-wise direction. Through electrodes 33 are formed in the through holes 32, respectively. The through electrodes 33 extend through the core substrates 31 from the first surface 31A to the second surface 31B in the thickness-wise direction. The material of the through electrodes 33 may be, for example, copper (Cu) or a copper alloy.

Further, a cavity 34 is formed at a given location in the core substrate 31. The cavity 34 extends through the core substrates 31 from the first surface 31A to the second surface 31B in the thickness-wise direction. The cavity 34 is tapered so that an opening width of the cavity 34 decreases from the lower side (second surface 31B of the core substrate 31) toward the upper side (first surface 31A of the core substrate 31) in FIG. 1.

The core substrate 31 includes through holes 35 surrounding the cavity 34. The through holes 35 are spaced apart from each other. Further, the through holes 35 are spaced apart from the cavity 34. The through holes 35 are located, for example, in a region between the cavity 34 and the through electrodes 32. The through holes 35 extend through the core substrates 31 from the first surface 31A to the second surface 31B in the thickness-wise direction. In the same manner as the cavity 34, the through holes 35 are tapered so that an opening width of each through hole 35 decreases from the lower side (second surface 31B) toward the upper side (first surface 31A) in FIG. 1.

Figure 2A:
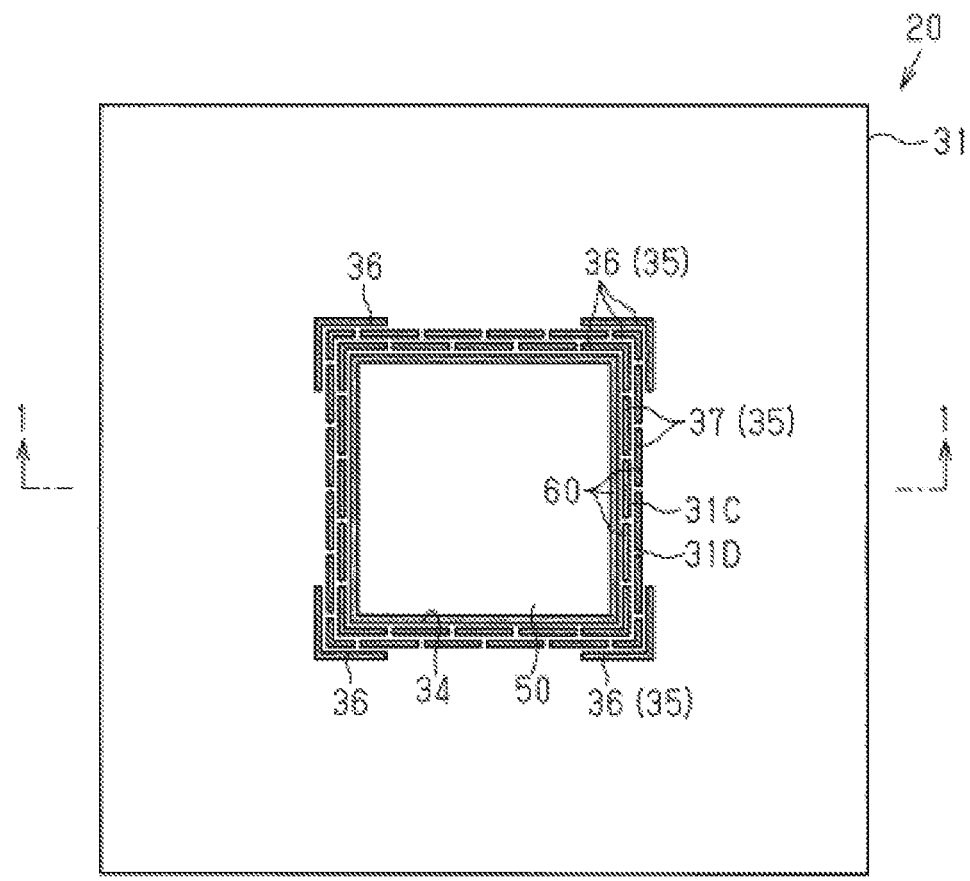
FIG. 2A is a schematic plan view of the wiring substrate illustrated in FIG. 1

As illustrated in FIG. 2A, the cavity 34 has a planar shape that is, for example, rectangular. In the present specification, the phrase "rectangular" includes not only a rectangle in strict terms but also a generally rectangular shape. For example, the phrase "rectangular" in a plan view includes a shape in which the corners of the cavity 34 are chamfered and a shape in which concave or convex portions are partially formed in the sides of the cavity 34. In the present example, the cavity 34 includes four corners and four sides connecting the corners in a plan view.

The through holes 35 are arranged in a plurality of lines (here, three lines) surrounding the peripheral edge (i.e., opening edge) of the cavity 34 in a plan view. In the following description, the through holes 35 arranged in line at a position that is closest to the peripheral edge of the cavity 34 are referred to as "a first line of through holes 35." The through holes 35 arranged in line at a position that is next to the first line of through holes 35 are referred to as "a second line of through holes 35." The through holes 35 arranged in line at a position that is next to the second line of through holes 35 are referred to as "a third line of through holes 35."

The first line of through holes 35 and the second line of through holes 35 surround the entire peripheral edge of the cavity 34 in a plan view. The first line of through holes 35 is spaced apart from the second line of through holes 35. In the present example, the core substrate 31 includes a beam 31C that is arranged between the first line of through holes 35 and the second line of through holes 35. Thus, the through holes 35 in the first line are separated from the through holes 35 in the second line by the beam 31C that is formed by a portion of the core substrate 31. In the present example, the beam 31C has the shape of a rectangular frame that surrounds the entire peripheral edge of the cavity 34 in a plan view.

The first line of through holes 35 includes four through holes 36 arranged along the four corners of the cavity 34. Further, the first line of through holes 35 includes a plurality of through holes 37 arranged in line, along the four sides of the cavity 34 defining the peripheral edge, via the through holes 36 located at the corners of the cavity 34 in a plan view. Similarly, the second line of through holes 35 includes four through holes 36, which are arranged along the four corners of the cavity 34, and a plurality of through holes 37, which are arranged in line, along the four sides of the cavity 34, via the through holes 36 located at the corners of the cavity 34 in a plan view.

Figure 2B:
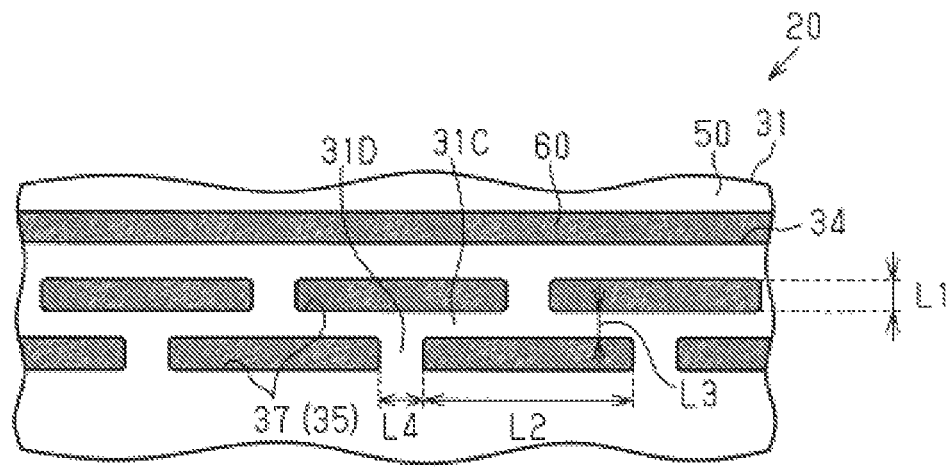
FIG. 2B is a partially, enlarged plan view of the wiring substrate illustrated in FIG. 2A.

As illustrated in FIG. 2B, each of the through holes 37 is, for example, an elongated hole that extends along the corresponding one of the four sides of the cavity 34 in a plan view. For example, the through hole 37 is formed in an ellipse or rectangular shape that has long sides along the corresponding one of the four sides of the cavity 34 in a plan view. In the present specification, with regard to the shape of the through hole 37, the phrase "rectangular" includes not only a rectangle in strict terms but also a generally rectangular shape. For example, the phrase "rectangular" in a plan view includes a shape in which the corners of the through hole 37 are chamfered and a shape in which concave or convex portions are partially formed in the sides of the through hole 37.

In each of the first and second lines, some (three in the first line and four in the second line) of the through holes 37 are arranged in line at given intervals along the corresponding side of the cavity 34 between two adjacent ones of the through holes 36. In each of the first and second lines, the through holes 37 are spaced apart from each other in a long-side direction of each through hole 37. In the present example, the core substrate 31 includes bridges 31D, each of which is arranged between two adjacent ones of the through holes 35 (including through holes 36 and 37) in the long-side direction of each through hole 37 in each of the first and second lines.

The through holes 37 in the first line and the through holes 37 in the second line are arranged, for example, in a staggered manner in a plan view. In other words, two through holes 37, which are adjacent in the short-side direction of each through hole 37 between the first line and the second line, are arranged so that the positions of the two adjacent through holes 37 are displaced from each other in the long-side direction of each through hole 37. Thus, each of the bridge 31D arranged in one of the adjacent first and second lines faces toward one of the through holes 37 arranged in the other one of the adjacent first and second lines.

The size of the cavity 34 is approximately 10 mm×10 mm in a plan view. Each of the through holes 37 has a width L1 (length in a short-side direction) that is, for example, approximately 200 μm. Further, each of the through holes 37 has a length L2 in the long-side direction that is, for example, approximately 1 mm. The ratio of the length L2 to the width L1, that is, L1:L2 may be, for example, approximately 1:5 to 1:20. The beam 31C has a width L3 that may be set to, for example, a length that is approximately one to two times the width L1 of the through hole 37. The width L3 corresponds to the distance between two through holes 35 that are adjacent in the short-side direction of each through hole 37. The bridges 31D each have a width L4 that may be set to, for example, a length that is approximately one to two times the width L1 of the through hole 37. The width L4 corresponds to the distance between two through holes 35 that are adjacent in the long-side direction of each through hole 37.

As illustrated in FIG. 2A, the through holes 36 are formed along the corners of the cavity 34 in a plan view. In the present example, the through hole 36 is L-shaped in a plan view and formed continuously along two of the sides of the cavity 34 that define the corresponding corner. The through hole 36 has a given width. In the present example, the width of the through hole 36 is the same as the width L1 (refer to FIG. 2B) of the through hole 37. The both ends of the through hole 36 are rounded.

The third line of through holes 35 only includes four through holes 36 arranged along the four corners of the cavity 34. Thus, in the wiring substrate 20, the number of lines (here, three lines) in which the through holes 36 are arranged around the corners of the cavity 34 is set to be greater than the number of lines (here, two lines) in which the through holes 37 are arranged along the sides of the cavity 34.

As illustrated in FIG. 1, the wiring layer 41 is formed on the first surface 31A of the core substrate 31. In the present example, the wiring layer 41 is formed on the upper surface (first surface 31A) of each of a portion of the core substrate 31, the beam 31C, and the bridges 31D (refer to FIG. 2B), which are located between the cavity 34 and the through holes 35. The wiring layer 42 is formed on the second surface 31B of the core substrate 31. In the present example, the wiring layer 42 is formed on the lower surface (second surface 31B) of each of a portion of the core substrate 31, the beam 31C, and the bridges 31D, which are located between the cavity 34 and the through holes 35. Portions of the wiring layers 41 and 42 are formed in a solid shape in the region in which the through holes 35 are formed and its peripheral region. The material of the wiring layers 41 and 42 may be, for example, copper or a copper alloy.

An electronic component 50 is arranged in the cavity 34. Electrodes 51 are formed on a first surface (in FIG. 1, upper surface) of the electronic component 50, and electrodes 52 are formed on a second surface (in FIG. 1, lower surface) of the electronic component 50. For example, the electrodes 51 are arranged on the same plane as the wiring layer 41, and the electrodes 52 are arranged on the same plane as the wiring layer 42. An example of the electronic component 50 is a semiconductor chip. The electronic component 50 has a coefficient of thermal expansion that is, for example, smaller than that of the core substrate 31. The material of the electrodes 51 and 52 may be, for example, copper or a copper alloy.

The cavity 34 is filled with an insulating material 60 that fixes the electronic component 50. A gap between the electronic component 50 and the walls of the cavity 34 is filled with the insulating material 60. The insulating material 60 contact and entirely cover side surfaces of the electronic component 50. The insulating material 60 covers the entire first surface of the electronic component 50 exposed from the electrodes 51, the entire side surfaces of each electrode 51, and a portion of the first surface of each electrode 51. The insulating material 60 also covers the entire second surface of the electronic component 50 exposed from the electrodes 52, the entire side surfaces of each electrode 52, and a portion of the second surface of each electrode 52. The through holes 35 are filled with the insulating material 60. Further, the insulating material 60 covers the entire first surface 31A of the core substrate 31 exposed from the wiring layer 41, the entire side surfaces of the wiring layer 41, and a portion of the first surface of the wiring layer 41. The insulating material 60 also covers the entire second surface 31B of the core substrate 31 exposed from the wiring layer 42, the entire side surfaces of the wiring layer 42, and a portion of the second surface of the wiring layer 42.

As the insulating material 60, a material having a higher coefficient of thermal expansion than the core substrate 31 is preferably used. Further, a material having a higher elastic modulus than the core substrate 31 is preferably used as the insulating material 60. The insulating material 60 may be, for example, an insulative resin, such as an epoxy resin, a polyimide resin, an acrylic resin, or a resin material obtained by mixing a filler of silica or alumina in the insulative resin.

The wiring substrate 20 includes a wiring unit 22, which is formed on a first surface 60A (in FIG. 1, upper surface) of the insulating material 60, and a wiring unit 23, which is formed on a second surface 60B (in FIG. 1, lower surface) of the insulating material 60.

The wiring unit 22 includes wiring layers and insulation layers alternatively stacked. The number of the wiring layers and the number of the insulation layers are not particularly limited. Each of the insulation layers has a thickness that is sufficient to insulate adjacent ones of the wiring layers from each other. For example, the wiring unit 22 includes a wiring layer 71, an insulation layer 72, a wiring layer 73, an insulation layer 74, and a wiring layer 75, which are stacked in this order on the first surface 60A of the insulating material 60. The material of the wiring layers 71, 73, and 75 may be, for example, copper or a copper alloy. The material of the insulation layers 72 and 74 may be, for example, an insulative resin such as an epoxy resin, a polyimide resin, or an acrylic resin.

The wiring layer 71 is connected to the wiring layer 41 or the electrodes 51 by vias extending through the insulating material 60. The wiring layer 73 is connected to the wiring layer 71 by vias extending through the insulation layer 72. The wiring layer 75, which is an outermost layer (in FIG. 1, uppermost layer) is connected to the wiring layer 73 by vias extending through the insulation layer 74. The wiring layer 75 includes electronic component connection pads P1 that are electrically connected to an electronic component such as a semiconductor chip 91 (refer to FIG. 3).

In the same manner, the wiring unit 23 includes wiring layers and insulation layers alternatively stacked. The number of the wiring layers and the number of the insulation layers are not particularly limited. Each of the insulation layers has a thickness that is sufficient to insulate adjacent ones of the wiring layers from each other. For example, the wiring unit 23 includes a wiring layer 81, an insulation layer 82, a wiring layer 83, an insulation layer 84, and a wiring layer 85, which are stacked in this order on the second surface 60B of the insulating material 60. The material of the wiring layers 81, 83, and 85 may be, for example, copper or a copper alloy. The material of the insulation layers 82 and 84 may be, for example, an insulative resin such as an epoxy resin, a polyimide resin, or an acrylic resin.

The wiring layer 81 is connected to the wiring layer 42 or the electrodes 52 by vias extending through the insulating material 60. The wiring layer 83 is connected to the wiring layer 81 by vias extending through the insulation layer 82. The wiring layer 85, which is an outermost layer (in FIG. 1, lowermost layer) is connected to the wiring layer 83 by vias extending through the insulation layer 84. The wiring layer 85 includes external connection pads P2.

Figure 3:
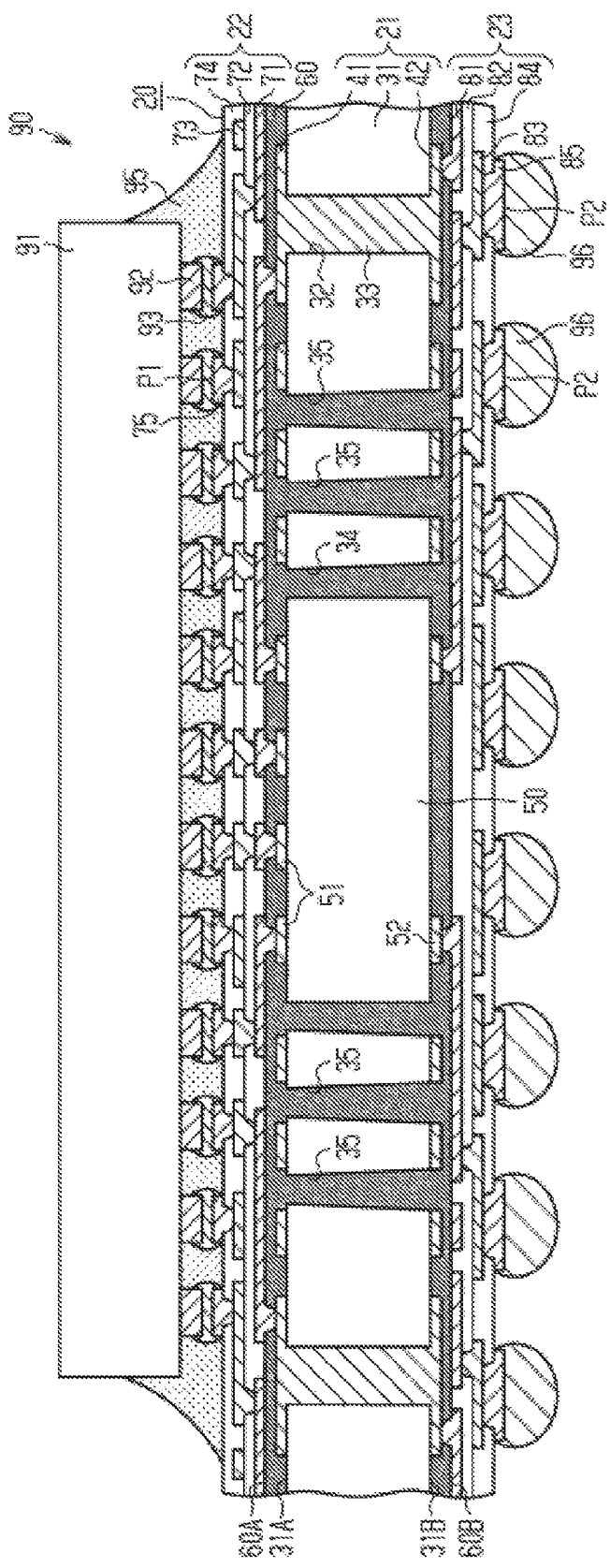
FIG. 3 is a schematic cross-sectional view illustrating a semiconductor device including the wiring substrate of FIG. 1.

A semiconductor device 90 will now be described with reference to FIG. 3.

The semiconductor device 90 includes the wiring substrate 20, the semiconductor chip 91 mounted on the wiring substrate 20, an underfill resin 95 formed between the wiring substrate 20 and the semiconductor chip 91.

The semiconductor chip 91 is flip-chip mounted on the wiring substrate 20. The semiconductor chip 91 has a circuit formation surface (in FIG. 3, lower surface) on which connection terminals 92 are arranged. Bonding members 93 bond the connection terminals 92 of the semiconductor chip 91 to the pads P1 of the wiring substrate 20. Thus, the semiconductor chip 91 is connected to the pads P1 (wiring layer 75) by the connection terminals 92 and the bonding member 93.

The material of the connection terminals 92 may be, for example, copper or a copper alloy. For example, a tin (Sn) layer or a solder plating may be used for the bonding members 93. The material of the solder plating may be, for example, lead (Pb)-free solder.

Bumps 96 are formed on the pads P2 of the wiring substrate 20. The bumps 96 are used to mount the semiconductor device 90 on a mounting substrate such as a motherboard. The material of the bumps 96 may be, for example, solder. Terminals such as lead pins may be connected to the pads P2.

A method for manufacturing the wiring substrate 20 will now be described with reference to FIGS. 4A to 9A, which include only the reference characters used to describe each step.

Firstly, the process for obtaining a structure illustrated in FIG. 4A will now be described.

The through holes 32 are formed in the core substrate 31 having a given thickness. For example, a laser processing machine or a drilling machine may be used to form the through holes 32. For example, when forming the through holes 32 with a laser processing machine, a desmear process is performed to remove residual resin smears or the like from the through holes 32. The desmear process may use, for example, potassium permanganate.

Then, the through electrodes 33 are formed in the through holes 32, the wiring layer 41 is formed on the first surface 31A (here, lower surface) of the core substrate 31, and the wiring layer 42 is formed on the second surface 31B (here, upper surface) of the core substrate 31. For example, the through electrodes 33 are formed in the through holes 32 by undergoing electroless copper plating and electrolytic copper plating, and then a subtractive process is performed to form the wiring layers 41 and 42.

In the step illustrated in FIG. 4B, the cavity 34 and the through holes 35 are formed in the core substrate 31. The through holes 35 are spaced apart from each other and also from the cavity 34. For example, a laser processing machine may be used to form the cavity 34 and the through holes 35. In this case, the second surface 31B of the core substrate 31 is irradiated with a laser beam to form the cavity 34 and the through holes 35. Consequently, the cavity 34 and the through holes 35 are tapered so that an opening width decreases from the second surface 31B to the first surface 31A of the core substrate 31. In this step, when forming the cavity 34 and the through holes 35 in the core substrate 31, a portion of the wiring layer 41 and a portion of the wiring layer 42 may be removed. Instead of using a laser processing machine, a punching press machine with a mold, a drilling machine, a router machine may be used to form the cavity 34 and the through holes 35.

In the step illustrated in FIG. 4C, a film 100 is applied to one surface (here, first surface 31A) of the core substrate 31 to temporarily fix the core substrate 31 on the film 100. The film 100 is adhered to, for example, the first surface (here, lower surface) of the wiring layer 41. A material having superior chemical resistance or superior heat resistance may be used for the film 100. For example, a polyimide or polyester film on which an adhesive layer is arranged may be used as the film 100.

In the step illustrated in FIG. 5A, a mounter is used to temporarily fix the electronic component 50 on the film 100 in the cavity 34 of the core substrate 31. The electronic component 50 is fixed such that the first surface (here, lower surface) of each electrode 51 is in contact with an upper surface of the film 100.

In the step illustrated in FIG. 5B, an insulating resin 101 is located above the second surface 31B of the core substrate 31. The insulating resin 101 has a higher coefficient of thermal expansion than the core substrate 31. Further, the insulating resin 101 has a higher elastic modulus than the core substrate 31. The material of the insulating resin 101 may be, for example, an insulative resin, such as an epoxy resin, a polyimide resin, an acrylic resin, or a resin material obtained by mixing a filler of silica or alumina in the insulative resin. The insulating resin 101 is formed in a semi-cured state (B-stage) in this step.

In the step illustrated in FIG. 6A, the insulating resin 101 is pressed against the film 100 with a pressing machine or the like under a depressurized atmosphere (for example, vacuum atmosphere). Thus, the cavity 34 and the through holes 35 are filled with the insulating resin 101. Further, a gap between the core substrate 31 and the film 100 and a gap between the electronic component 50 and the film 100 are filled with the insulating resin 101. The insulating resin 101 covers the second surface 31B of the core substrate 31 exposed from the wiring layer 42, the entire side surfaces and the entire second surface (here, upper surface) of the wiring layer 42, the second surface (here, upper surface) of the electronic component 50 exposed from the electrodes 52, and the entire side surfaces and the entire second surface (here, upper surface) of each electrode 52. In this manner, the entire surface located opposite to the surface on which the film 100 is applied is covered by the insulating resin 101. In this step, the insulating resin 101 is not thermally cured and is left in the semi-cured state.

Since the through holes 35 are spaced apart from each other and also from the cavity 34, each of the through holes 35 is surrounded by the core substrate 31 (for example, beam 31C and bridges 31D). Thus, the insulating resin 101 flows into the through holes 35 from the second surface 31B of the core substrate 31 surrounding the through holes 35. This ensures that the through holes 35 are filled with an adequate amount of resin. Therefore, the through holes 35 are appropriately filled with the insulating resin 101. Thus, the formation of voids in the insulating resin 101 and the formation of dips in the second surface 101B (here, upper surface) of the insulating resin 101 may be suppressed.

In the step illustrated in FIG. 6B, the film 100 illustrated in FIG. 6A is removed. Portions that are in contact with the film 100, that is, the first surfaces (here, lower surfaces) of the insulating resin 101, the wiring layer 41, and the electrodes 51 are formed to be flat and be flush with each other.

In the step illustrated in FIG. 6C, an insulating resin 102, which covers the first surface of the wiring layer 41, is formed on the first surface of the insulating resin 101. In the same as the step illustrated in FIG. 6A, the insulating resin 102 flows into the through holes 35 from the first surface 31A of the core substrate 31 surrounding the through holes 35. Therefore, the through holes 35 are appropriately filled with the insulating resin 102. Thus, the formation of dips in the first surface 102A (here, lower surface) of the insulating resin 102 may be suppressed.

Instead of using the film 100 illustrated in FIG. 6A, an adhesive insulating resin may be used to fix the components described above. In this case, in the step illustrated in FIG. 6A, the cavity 34 and the through holes 35 are filled with both of the insulating resin 101 and the adhesive insulating resin. In such a case, the steps illustrated in FIGS. 6B and 6C (that is, the steps of removing of the film 100 and forming the insulating resin 102) may be omitted.

Figure 7A:
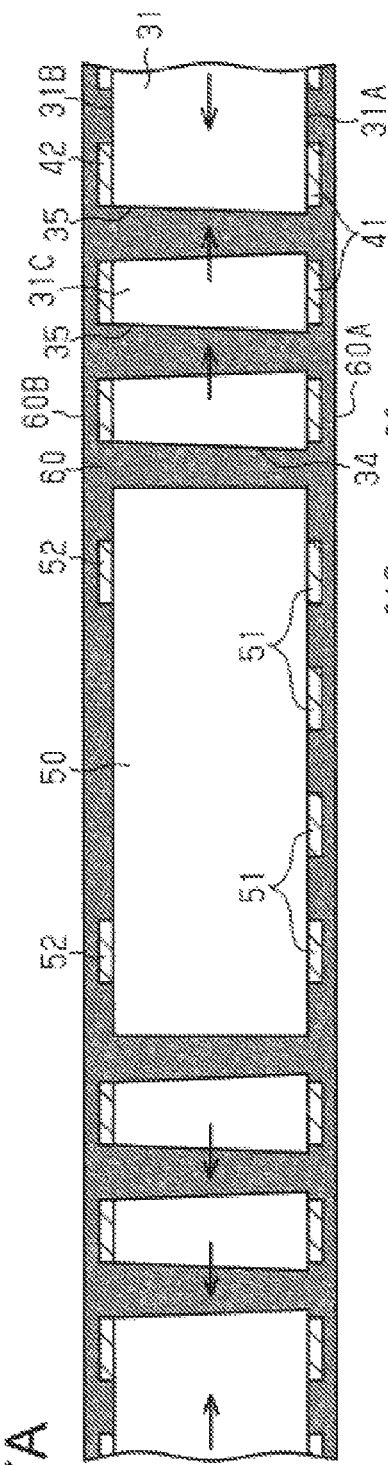

Then, the insulating resins 101 and 102 that are in the semi-cured state are thermally cured and hardened under a temperature atmosphere of approximately 150° C. to 200° C. Consequently, as illustrated in FIG. 7A, the insulating material 60 that fills the cavity 34 and the through holes 35 and covers the first surface 31A and the second surface 31B of the core substrate 31 is formed. The cavity 34 is filled with the insulating material 60 that entirely covers the electronic component 50. Thus, the insulating material 60 fixes the electronic component 50 in the cavity 34. In FIGS. 7A to 9B, the insulating resins 101 and 102 that are hardened and integrally formed are illustrated as the insulating material 60.

In the thermal cure processing, the core substrate 31 and the electronic component 50 are expanded by the high temperature and the position of each component is fixed by hardening of the insulating material 60. The structure illustrated in FIG. 7A is then cooled. The electronic component 50 has a lower coefficient of thermal expansion than the core substrate 31. Thus, the contraction of the core substrate 31 becomes larger than that of the electronic component 50. This applies compressive stress to the electronic component 50. In this regard, in the present embodiment, the through holes 35 surrounding the cavity 34 are filled with the insulating material 60 having a higher coefficient of thermal expansion than the core substrate 31. Therefore, when the structure illustrate in FIG. 7A is cooled, the contraction of the insulating material 60 filled in the through holes 35 becomes larger than that of the core substrate 31. Since the insulating material 60 contracts toward the inside of each through hole 35, the peripheral edge of the cavity 34 is pulled outwardly (refer to arrows in FIG. 7A). Thus, compressive stress applied to the electronic component 50 is decreased. Further, even when the through holes 35 are filled with the insulating material 60 having a lower elastic modulus than the core substrate 31, stress caused by elastic deformation of the insulating material 60 is decreased. Thus, compressive stress applied to the electronic component 50 is decreased.

The compressive stress applied to the electronic component 50 during the cooling is the maximum at the corners of the electronic component 50. This is because an amount of contraction of the insulating material 60 is the maximum at the corners of the cavity 34. In this regard, in the present embodiment, as illustrated in FIG. 2A, each of the through holes 36 arranged around the corners of the cavity 34 is L-shaped in a plan view and formed continuously along the corresponding two sides of the cavity 34 that define the corresponding corner. Thus, the amount of contraction of the insulating material 60 toward the electronic component 50 at the corners of the peripheral edge of the cavity 34 is decreased. Consequently, the compressive stress applied to the corners of the electronic component 50 is decreased. Further, as illustrated in FIG. 2A, the number of lines (here, three lines) in which the through holes 36 are arranged around the corners of the cavity 34 is set to be greater than the number of lines (here, two lines) in which the through holes 37 are arranged along the sides of the cavity 34. Thus, the compressive stress applied to the corners of the electronic component 50 is further effectively decreased.

Figure 7B:
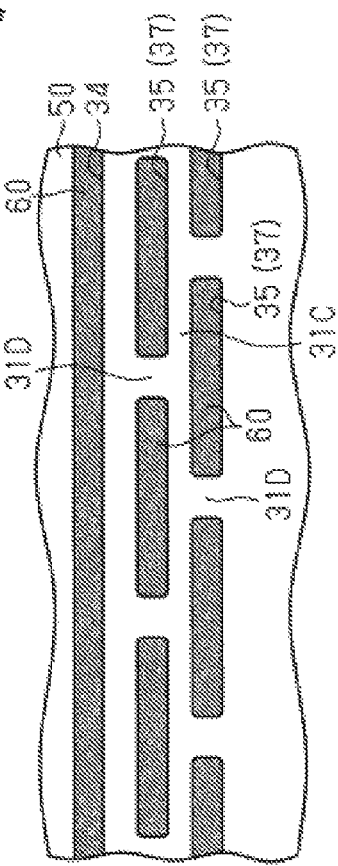
FIG. 7B is a schematic plan view illustrating through holes formed in the wiring substrate of FIG. 7A.

Additionally, as illustrated in FIG. 7B, each of the through holes 35 (37) is formed in an elongated shape that extends along the corresponding one of the sides of the cavity 34 in a plan view, and the through holes 35 (37) in the first line and the through holes 35 (37) in the second line are arranged in a staggered manner in a plan view. Thus, the beam 31C is located between the through holes 35 (37) in the first line and the through holes 35 (37) in the second line, and each of the bridge 31D arranged in one of the first and second lines that are adjacent faces toward one of the through holes 35 (37) arranged in the other one of the first and second lines. In this structure, the compressive stress generated during the cooling is intensively applied to the beam 31C and the bridges 31D. Therefore, the beam 31C and the bridges 31D are preferentially deformed. Thus, the compressive stress applied to the electronic component 50 may be decreased. In this manner, in the present embodiment, the through holes 35 (37) in the first line and the through holes 35 (37) in the second line are arranged in a staggered manner so as to form portions, such as the beam 31C and the bridges 31D, which are likely to be deformed. This decreases the compressive stress applied to the electronic component 50.

Figure 7C:
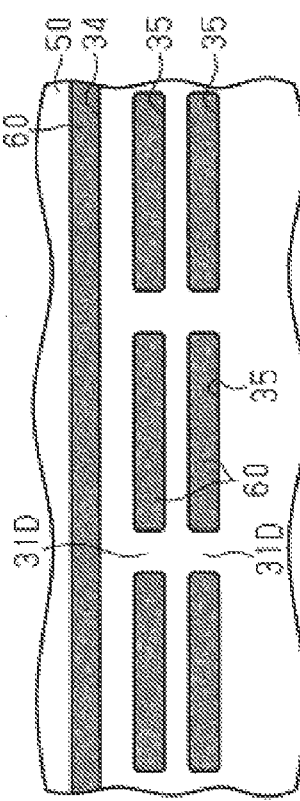
FIG. 7C is a schematic plan view illustrating through holes formed in a wiring substrate of a modified example.

As illustrated in FIG. 7C, when the through holes 35 in the first line and the through holes 35 in the second line are arranged at the same position in the long-side direction, the adjacent bridges 31D between the first line and the second line faces each other. Therefore, the bridges 31D are not preferentially deformed. In contrast, when the through holes 35 in the first line and the through holes 35 in the second line are arranged in a staggered manner, the number of portions that are likely to be deformed is increased. Thus, the compressive stress applied to the electronic component 50 is decreased.

Accordingly, the deformation of a peripheral portion of the electronic component 50 due to the compressive stress generated during the cooling is suppressed. This suppresses the formation of irregularity in the first surface 60A and the second surface 60B of the insulating material 60. Further, since the formation of dips in the second surface 101B (refer to FIG. 6A) of the insulating resin 101 and the first surface 102A (refer to FIG. 6C) of the insulating resin 102 is suppressed, the formation of dips in the first surface 60A and the second surface 60B of the insulating material 60 is suppressed. This ensures the flatness of the first surface 60A and the second surface 60B of the insulating material 60. Accordingly, the wiring unit 22 may be easily formed on the first surface 60A of the insulating material 60, and the wiring unit 23 may be easily formed on the second surface 60B of the insulating material 60.

In the step illustrated in FIG. 8A, via holes 61 that partially expose the first surface of the wiring layer 41 and via holes 62 that partially expose the first surface of each electrode 51 are formed in the first surface 60A of the insulating material 60. Further, via holes 63 that partially expose the second surface of the wiring layer 42 and via holes 64 that partially expose the second surface of each electrode 52 are formed in the second surface 60B of the insulating material 60. For example, a laser processing machine may be used to form the via holes 61 to 64. FIG. 8A illustrates FIG. 4 a state in which the structure illustrated in FIG. 7A is upside down.

In the step illustrated in FIG. 8B, vias are formed in the via holes 61 and 62, and the wiring layer 71 is stacked on the first surface 60A of the insulating material 60. The via in the via hole 61 electrically connects the wiring layer 71 to the wiring layer 41, and the vias in the via holes 62 electrically connect the wiring layer 71 to the electrodes 51. Similarly, vias are formed in the via holes 63 and 64, and the wiring layer 81 is stacked on the second surface 60B of the insulating material 60. The via in the via hole 63 electrically connects the wiring layer 81 to the wiring layer 42, and the vias in the via holes 64 electrically connect the wiring layer 81 to the electrodes 52. The wiring layers 71 and 81 may be formed, for example, through various types of wiring formation processes such as a semi-additive process or a subtractive process.

In the step illustrated in FIG. 9A, a build-up process is performed to form the wiring unit 22 on the first surface 60A of the insulating material 60 and form the wiring unit 23 on the second surface 60B of the insulating material 60. The wiring structure 20 is manufactured through the manufacturing steps described above.

A method for manufacturing the semiconductor device 90 will now be described.

In the step illustrated in FIG. 9B, the bumps 96 are formed on the pads P2 of the wiring substrate 20. Further, the semiconductor chip 91, which includes the connection terminals 92 formed on the circuit formation surface and the bonding members 93 formed on the lower surfaces of the connection terminals 92, is prepared. Then, the semiconductor chip 91 is flip-chip bonded to the pads P1.

Then, a gap between the semiconductor chip 91 and the wiring substrate 20 that are flip-chip bonded is filled with the underfill resin 95 (refer to FIG. 3), and the underfill resin 95 is hardened. The semiconductor device 90 illustrated in FIG. 3 is manufactured through the manufacturing steps described above.

The present embodiment has the advantages described below.

(1) The through holes 36 (35) are arranged along the corners of the cavity 34 in a plan view. The through holes 36 are spaced apart from the cavity 34. Each of the through holes 36 is L-shaped in a plan view and formed continuously along two of the sides of the cavity 34 that define the corresponding corner. The through holes 36 are filled with the insulating material 60. In this structure, when the insulating material 60 is thermally cured and then cooled, the corners of the peripheral edge of the cavity 34 are pulled outwardly. Thus, compressive stress applied to the corners of the electronic component 50 at which the stress is maximum may be decreased. This may suppress the deformation of the peripheral portion of the electronic component 50 due to the compressive stress and suppress the formation of the irregularity in the first surface 60A and the second surface 60B of the insulating material 60.

Further, each of the through holes 35 is surrounded by the core substrate 31. Thus, the insulating resins 101 and 102 flow into the through holes 35 from the upper and lower surfaces of the core substrate 31 surrounding the through holes 35. This ensures that the through holes 35 are filled with an adequate amount of resin. Therefore, the through holes 35 are appropriately filled with the insulating resins 101 and 102. Thus, the formation of dips in the second surface 101B of the insulating resin 101 and the first surface 101A of the insulating resin 102 may be suppressed. Consequently, the formation of dips in the first surface 60A and the second surface 60B of the insulating material 60 that is hardened may be suppressed.

Accordingly, the first surface 60A and the second surface 60B of the insulating material 60 may be formed to be flat. This allows the wirings to be easily formed on the first surface 60A and the second surface 60B of the insulating material 60.

(2) The through holes 37 (35) are arranged in line along the sides of the cavity. The through holes 37 are spaced apart from each other and also from the cavity 34. The through holes 37 are filled with the insulating material 60. In this structure, when the insulating material 60 is thermally cured and cooled, the sides of the peripheral edge of the cavity 34 are pulled outwardly. Thus, compressive stress applied to the electronic component 50 may be decreased.

(3) Each of the through holes 37 (35) is formed in an elongated shape. The through holes 37 in the first line and the through holes 37 in the second line are arranged in a staggered manner in a plan view. Thus, the core substrate 31 includes a number of portions that are likely to be deformed, such as the beam 31C and the bridges 31D, around the cavity 34. Thus, compressive stress applied to the electronic component 50 may be decreased.

(4) The width L3 of the beam 31C is set to a length that is approximately one to two times the width L1 of the through hole 37. This ensures that the through holes 35 are filled with an adequate amount of resin when forming the insulating resins 101 and 102 in the through holes 35. Thus, the through holes 35 are appropriately filled with the insulating resins 101 and 102.

(5) The wiring unit 22 is formed on the first surface 60A of the insulating material 60 at which a smaller opening width of each of the cavity 34 and the through holes 35 is located. The semiconductor chip 91 is mounted on the uppermost wiring layer 75 of the wiring unit 22. The filling property of the insulating resins 101 and 102 in the cavity 34 and the through holes 35 is enhanced at the side of a smaller opening width of each of the cavity 34 and the through holes 35 as compared to the side of a larger opening width thereof. Thus, the formation of dips in the first surface 60A of the insulating material 60 is restricted. Therefore, the wiring unit 22 including finer wirings may be formed on the first surface 60A of the insulating material 60 having satisfactory flatness. Accordingly, the wiring layers 71, 73, and 75 in the wiring unit 22 may easily be miniaturized.

(6) The insulating resin 101 flows into the cavity 34 and the through holes 35 from a larger opening width of each through hole 35 when the through holes 35 are filled with the insulating resin 101. The cavity 34 and the through holes 35 are tapered so that an opening width decreases from the side supplied with the insulating resin 101 toward the film 100 (refer to FIG. 5B). This may enhance the filling property of the insulating resin 101 in the cavity 34 and the through holes 35.

(7) By appropriately changing the design (planar shape and arrangement) of the through holes 35, stress distribution in the wiring substrate 20 may be adjusted.

It should be apparent to those skilled in the art that the foregoing embodiments may be employed in many other specific forms without departing from the scope of this disclosure. Particularly, it should be understood that the foregoing embodiments may be employed in the following forms.

In the above embodiment, the number of lines in which the through holes 35 are arranged may be appropriately changed. For example, the number of lines may be changed to one line, two lines, or four lines or more. Further, the number of lines in which the through holes 36 are arranged may be the same as the number of lines in which the through holes 37 are arranged.

Figure 10A:
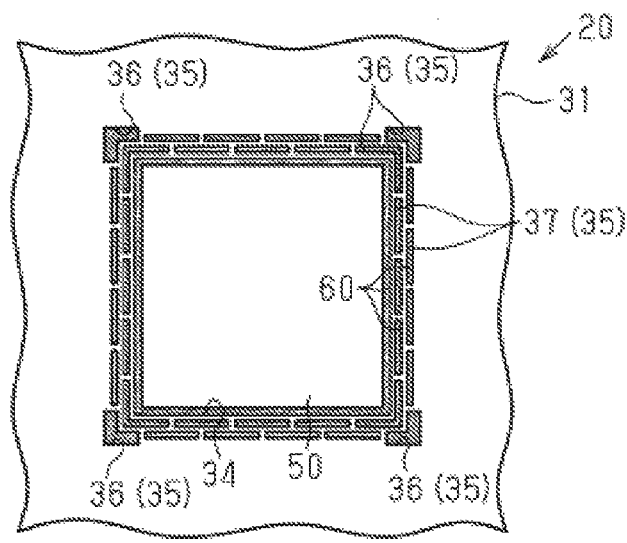
FIGS. 10A to 10C are schematic plan views illustrating wiring substrates in various modified examples.

As illustrated in FIG. 10A, at least one of the through holes 36 may have a larger width than each of the through holes 37. In the example of FIG. 10A, although only the through holes 36 arranged in the second line have a larger width than each of the through holes 37, the through holes 36 arranged in the first line may also have a larger width than each of the through holes 37.

In the above embodiment, the arrangement of the through holes 35 in a plan view may be approximately changed. For example, as illustrated in FIG. 7C, the through holes 35 in the first line and the through holes 35 in the second line are arranged at the same position in the long-side direction.

Figure 10B:
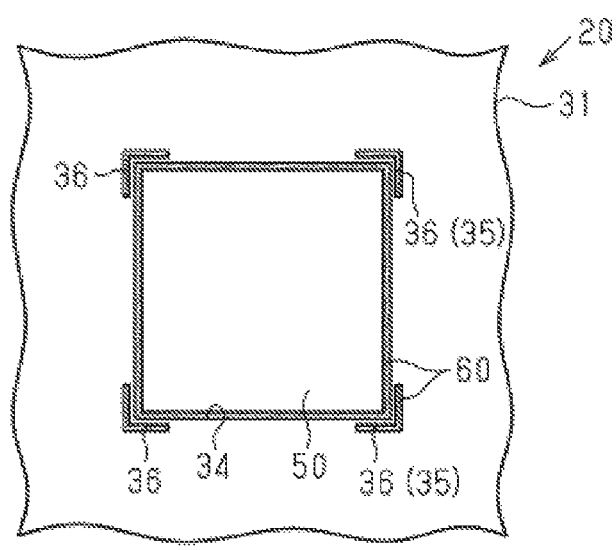
Figure 10C:
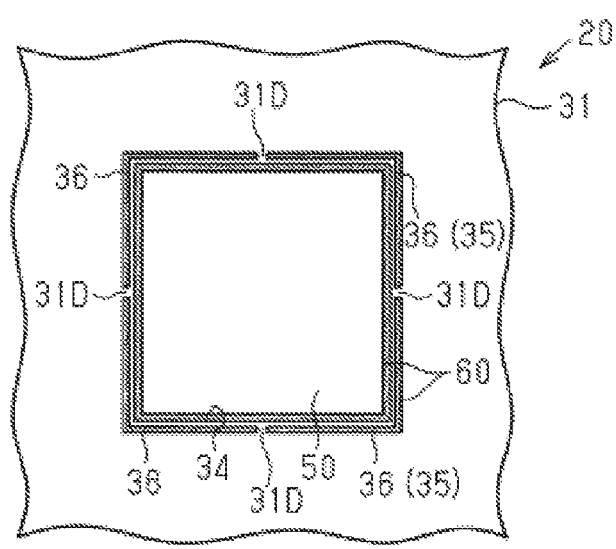
Figure 11A:
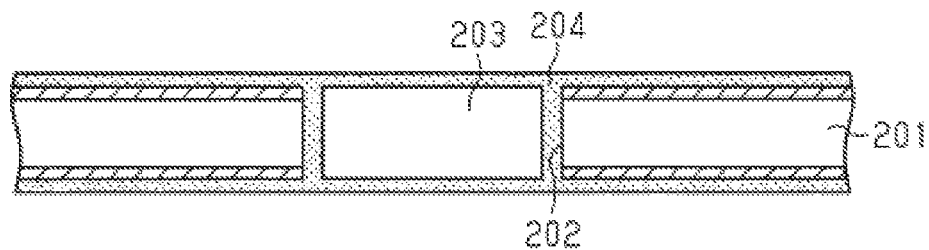
FIGS. 11A to 11D are schematic cross-sectional views illustrating a method for manufacturing a wiring substrate in a related art.
Figure 11B:
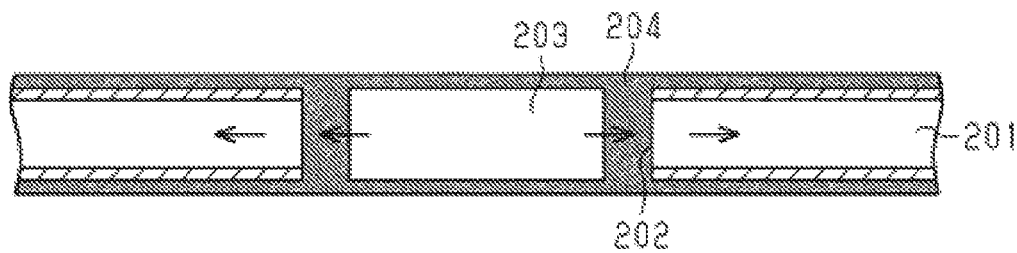
Figure 11C:
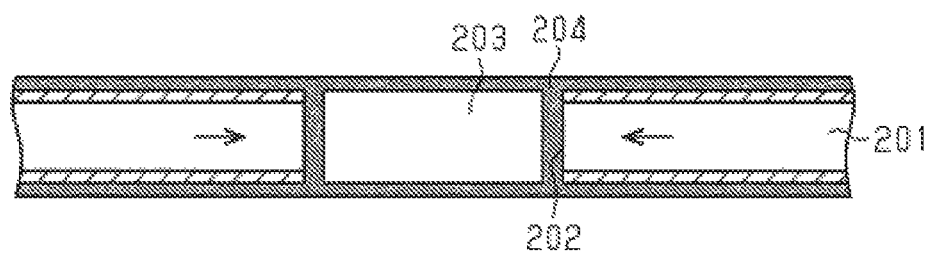
Figure 11D:
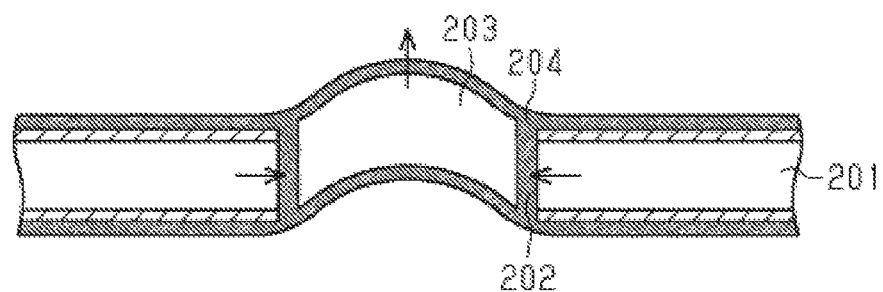

As illustrated in FIGS. 10B and 10C, the through holes 37 may be omitted, and only the through holes 36 may be formed. For example, as illustrated in FIG. 10B, the through holes 36 may be formed around only the corners of the cavity 34. Alternatively, as illustrated in FIG. 10C, the through holes 36 may be formed so that the four through holes 36 substantially surround the entire peripheral edge (i.e., four corners and four sides) of the cavity 34 in a plan view. In this case, the core substrate 31 includes four bridges 31D each of which is arranged between the two adjacent ones of the four through holes 36. In the examples of FIGS. 10B and 10C, although the through holes 36 are arranged in one line, the number of lines in which the through holes 36 are arranged may be two or more.

In the above embodiment, an insulating material (first insulating material) with which the through holes 35 are filled may differ from an insulating material (second insulating material) with which the cavity 34 is filled. In this case, it is preferable that the insulating material with which the through holes 35 are filled have a higher coefficient of thermal expansion than, for example, the core substrate 31 and have a lower elastic modulus than the core substrate 31. Further, it is preferable that the insulating material with which the cavity 34 is filled have a lower coefficient of thermal expansion than, for example, the core substrate 31 and have a lower elastic modulus than the core substrate 31.

In this case, for example, in the step illustrated in FIG. 5B, by using a dispenser or the like, the through holes 35 are filled with a liquid insulating resin that is formed from a material having a higher coefficient of thermal expansion than the core substrate 31. Then, after the insulating resin filled in the through holes 35 is thermally cured, an insulating resin that is formed from a material having a low coefficient of thermal expansion than the core substrate 31 is laminated on the core substrate 31 so that the cavity 34 is filled with the insulating resin.

In the above embodiment, the cavity 34 and the through holes 35 may be formed to be straight (tetragonal in cross-sectional view). That is, the walls of the cavity 34 and the through holes 35 may be formed to extend in a direction perpendicular to the first surface 31A of the core substrate 31 in cross-sectional view.

In the above embodiment, the semiconductor chip 91 may be mounted on the uppermost wiring layer 85 of the wiring unit 23.

In the above embodiment, the number of semiconductor chips 91 mounted on the wiring substrate 20 and the mounting technique (e.g., flip-chip mounting, wiring bonding mounting, or combination thereof) of the semiconductor chips 91 may be appropriately changed.

In the above embodiment, the number of electronic components 50 incorporated in the wiring substrate 20 may be appropriately changed.

The electronic component 50 of the above embodiment is not limited to a semiconductor chip. Instead of the semiconductor chip, for example, a chip capacitor, a chip resistor, a chip inductor, an inductor, a thin film capacitor, or the like may be used as the electronic component 50.

In the above embodiment, the number of wiring layers and the number of insulation layers in each of the wiring units 22 and 23 may be appropriately changed.

The above embodiment and the above modifications may be appropriately combined.

Clause

This disclosure further encompasses the following embodiment.

A method for manufacturing a wiring substrate, the method including:

preparing a core substrate that includes a first surface and a second surface located opposite to the first surface;

forming a cavity and a plurality of first through holes, wherein the cavity and the first through holes extend through the core substrate from the first surface to the second surface, and the cavity and the first through holes are spaced apart from each other;

applying a film, which covers the cavity, to the first surface side of the core substrate;

arranging an electronic component in the cavity and fixing the electronic component to the film;

filling the first through holes with a first insulating material;

filling the cavity with a second insulating material and fixing the electronic component in the cavity; and removing the film from the core substrate, wherein the cavity has a planar shape that is rectangular, and includes corners and sides connecting the corners in a plan view, the first through holes are arranged around the corners of the cavity in a plan view, and each of the first through holes is L-shaped in a plan view and formed continuously along two of the sides of the cavity that define a corresponding one of the corners.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A wiring substrate comprising:
a core substrate including a first surface and a second surface located opposite to the first surface;
a cavity extending through the core substrate from the first surface to the second surface, wherein the cavity has a planar shape that is rectangular and the cavity includes corners and sides connecting the corners in a plan view;
a plurality of first through holes extending through the core substrate from the first surface to the second surface, wherein the first through holes are spaced apart from the cavity;
an electronic component arranged in the cavity;
a first insulating material with which the first through holes are filled; and
a second insulating material with which a gap between the electronic component and walls of the cavity is filled, wherein the first through holes are arranged around the corners of the cavity in a plan view, and
each of the first through holes is L-shaped in a plan view and formed continuously along two of the sides of the cavity that define a corresponding one of the corners.

2. The wiring substrate according to claim 1, further comprising a plurality of second through holes extending through the core substrate from the first surface to the second surface, wherein
the second through holes are spaced apart from the cavity and the first through holes,
the second through holes are arranged in line along the sides of the cavity in a plan view so that at least one of the second through holes is located between two adjacent ones of the first through holes,
each of the second through holes is an elongated hole that extends along a corresponding one of the sides of the cavity in a plan view, and
the second through holes are filled with the first insulating material.

3. The wiring substrate according to claim 2, wherein the second through holes are collinear with the first through holes along a line parallel to each side of the cavity in a plan view.

4. The wiring substrate according to claim 2, wherein
the second through holes are arranged in a plurality of lines along the sides of the cavity,
the core substrate includes a bridge that is arranged between two adjacent ones of the second through holes in at least one of the lines, and
the bridge arranged in one of the lines faces toward one of the second through holes arranged in another one of the lines that is adjacent in a short-side direction of each second through hole.

5. The wiring substrate according to claim 2, wherein
the second through holes are arranged in a plurality of lines along the sides of the cavity, and
a distance between two adjacent ones of the second through holes in a short-side direction of each second through hole is equal to or greater than a length of each of the second through holes in the short-side direction.

6. The wiring substrate according to claim 2, wherein
the second through holes are arranged in M lines along the sides of the cavity, wherein M is an integer of 1 or greater, and
the first through holes are arranged in N lines around the corners of the cavity, wherein N is an integer greater than M.

7. The wiring substrate according to claim 2, wherein at least one of the first through holes has a width that is greater than a length of each of the second through holes in a short-side direction of each second through hole.

8. The wiring substrate according to claim 1, wherein the first insulating material has a coefficient of thermal expansion higher than that of the core substrate.

9. The wiring substrate according to claim 1, wherein the first insulating material has an elastic modulus higher than that of the core substrate.

10. The wiring substrate according to claim 2, wherein each of the first insulating material and the second insulating material has a coefficient of thermal expansion higher than that of the core substrate.

11. The wiring substrate according to claim 2, wherein each of the first insulating material and the second insulating material has an elastic modulus higher than that of the core substrate.

12. A semiconductor device comprising:
a wiring substrate according to claim 1;
a wiring unit formed at a side of the first surface of the core substrate; and
a semiconductor chip mounted on the wiring unit, wherein
each of the first through holes is formed so that a width of each of the first through holes decreases from the second surface of the core substrate to the first surface of the core substrate.

* * * * *